United States Patent [19]

Davis, Jr.

[11] 4,225,827
[45] Sep. 30, 1980

[54] STABILIZATION CIRCUIT FOR TRANSISTOR RF POWER AMPLIFIERS

[75] Inventor: John F. Davis, Jr., Rochester, N.Y.
[73] Assignee: Harris Corporation, Melbourne, Fla.
[21] Appl. No.: 13,534
[22] Filed: Feb. 21, 1979
[51] Int. Cl.$^3$ ............................ H03F 1/26; H03F 3/20
[52] U.S. Cl. .................................... 330/296; 330/149; 330/298
[58] Field of Search ............... 330/149, 296, 298, 302, 330/306

[56] References Cited

U.S. PATENT DOCUMENTS

| 3,513,406 | 5/1970 | Leuthauser | 330/296 |
| 3,984,783 | 10/1976 | Bickley | 330/296 |

OTHER PUBLICATIONS

Minton, "Design Trade-Offs For R-F Transistor Power Amplifiers" *The Electronic Engineer* Mar. 1967, pp. 68–73.

*Primary Examiner*—James B. Mullins
*Attorney, Agent, or Firm*—L. Lawton Rogers, III

[57] ABSTRACT

A stabilization circuit inhibits spurious oscillations of a Class C transistor power amplifier. A relatively large value resistor is connected in the base circuit of the amplifier transistor to inhibit the tendency of the amplifier to oscillate. A diode is added to the base circuit to prevent the possible failure of the transistor attendant to the use of the relatively high value resistor.

11 Claims, 3 Drawing Figures

STABILIZATION CIRCUIT FOR TRANSISTOR RF POWER AMPLIFIERS

BACKGROUND OF THE INVENTION

The present invention relates to transistor amplifier, and more particularly, to a stabilization circuit for a Class C transistor power amplifier of the type conventionally used in radio communications apparatus.

A Class C transistor amplifier is commonly defined as a transistor which is operative, i.e., conducting, for less than one-half of a cycle in the input signal to the transistor. For the remaining portion of the input signal cycle, the transistor remains in a cutoff condition and a very small value of cutoff current flows from the transistor due to the biasing of the transistor. However, when the input signal to the transistor amplifier lies within the radio frequency range, i.e. 10 KHz—100 GHz, the conventional definition of a Class C transistor amplifier in terms of output characteristics may not be entirely accurate. For example, when operating in the upper end of the radio frequency range, the response characteristics of the transistor amplifier may be such that the transistor remains in a conducting state throughout the entire cycle of the input signal. However, if the input signal to the transistor has a sufficiently low frequency, the output signal from the transistor amplifier will conform to the functional definition given previously.

Therefore, the term "Class C transistor amplifier", as used throughout the present specification, refers to the bias placed on the transistor rather than the output characteristics thereof. In other words, the Class C transistor amplifier to which the present invention pertains has a bias such that the transistor is conducting for less than one-half of the cycle of the input signal when the signal has a sufficiently low frequency, but may conduct for more than one-half of the input cycle at higher frequencies.

Since a Class C transistor amplifier utilizes a relatively sensitive transistor, one problem inherent to these amplifiers is the presence of spurious oscillations in the output signal of the amplifier. These oscillations can be caused by an input signal having a particular frequency, or by changes in the amplitude of the input signal or the load which is placed on the transistor.

In order to reduce to the inherent tendency of the transistor amplifier to oscillate, a solution has been proposed in which the transistor base circuit is connected to ground through a relatively large value resistor. This large value resistor substantially inhibits the tendency of the amplifier to oscillate and therefore appears to solve the problem. However, this method of inhibiting oscillations can only be used when the amplifier is operating under normal anticipated load. If the load changes from the optimum point, for example during tuning of the circuit in which the amplifier is located or inadvertent disconnection of an antenna from the circuit, high voltages can be developed in the transistor collector tuned circuit which may result in a voltage breakdown of the collector to base junction of the transistor. This collector to base breakdown has no serious consequences in a conventional amplifier circuit since the current resulting from the breakdown can be shunted to ground through an RF choke and/or a low value resistor. However, if the base circuit is connected to ground through a relatively large value resistor in order to obtain the stabilizing effect and thus inhibit oscillation, the collector-base breakdown will heavily forward bias the transistor which will in most cases result in destructive failure of the transistor.

The use of a transistor having a higher breakdown voltage does not solve this problem because there always exists some load variation which will cause a failure of the transistor. Furthermore, the operational characteristics of such a high breakdown transistor may not be correct from a design standpoint for the desired operation of the normal load, and therefore such a transistor will not be satisfactory. At present, there is no transistor available which is immune to all possible variations in the load and which operates in the proper fashion.

OBJECTS OF THE INVENTION

It is therefore an object of the present invention to provide a novel method and apparatus for preventing the spurious oscillations which are inherent to Class C transistor amplifiers.

It is another object of the present invention to provide a transistor amplifier stabilization circuit in which failure of the transistor due to changes in load conditions is substantially inhibited.

It is a further object of the present invention to provide a novel transistor amplifier stabilization circuit which requires a minimum number of components to achieve the previously recited objects.

These as well as other objects and advantages of the present invention will be apparent from a perusal of the following description of the preferred embodiment of the invention, when taken in conjunction with the accompanying drawings.

DESCRIPTION OF THE PREFERRED EMBODIMENT

In its preferred embodiment, the present invention relates to a power amplifier in a radio communications environment. It will be apparent, however, that the present invention is applicable to any environment in which a Class C power amplifier can be used, and particularly in those applications in which it is desirable or necessary to inhibit the spurious oscillations which are inherent to Class C power amplifiers.

Figure 1:
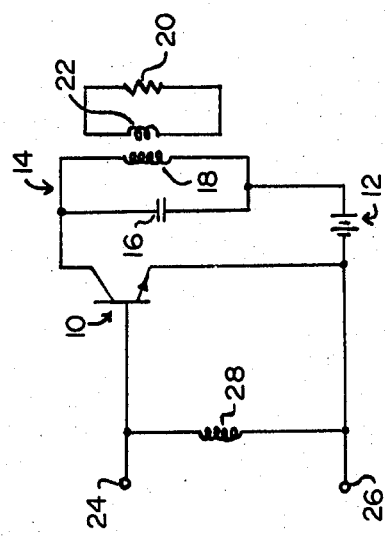
FIG. 1 is a schematic circuit diagram of a conventional Class C transistor amplifier.

A conventional Class C transistor power amplifier is illustrated in FIG. 1. The amplifier includes a transistor 10, such as a PT4261 NPN transistor. The transistor 10 is biased by means of a suitable source of biasing potential 12 so that it will operate in the Class C mode of operation, as defined previously. While only one source of biasing potential 12 is illustrated in FIG. 1, it will be apparent to those of ordinary skill in the art that additional bias potential sources may be necessary or desirable to achieve a Class C mode of operation. For example, an additional source of potential may be connected between the emitter and the base of the transistor 10.

A tank circuit 14, comprising a capacitor 16 and an inductor 18 connected in parallel, can be connected to the output terminal of the amplifier, i.e. the collector of the transistor 10. The tank circuit 14 operates as a resonant circuit and smoothes out any distortions in the output signal from the transistor 10 present due to the non-continuous conduction of the transistor 10 which is possible in the Class C mode of operation. A load 20 is inductively coupled to the tank circuit 14 by means of an inductor 22 to receive the amplified power signal from the amplifier.

The input signal to the Class C amplifier is applied to a pair of terminals 24, 26 which are respectively connected to the base and the emitter of the transistor 10. An inductor 28 may be coupled in shunt across these terminals to filter out low frequency noise in the input signal. The Class C amplifier operates to amplify the input signal with a high degree of efficiency and applies this amplified signal to the load 20 by means of the tank circuit 14 and the coupling inductor 22.

Figure 2:
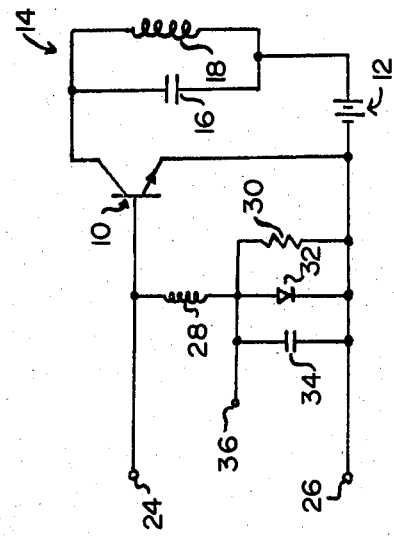
FIG. 2 is a schematic circuit diagram of a Class C transistor amplifier including the preferred embodiment of the stabilization circuit.

As noted previously, a transistor which is used in a Class C power amplifier is relatively sensitive. Due to this sensitivity, the transistor has a tendency to oscillate. The oscillations of the amplifier can cause the production of spurious output signals in a transmitter in which the amplifier is incorporated. A solution for inhibiting these oscillations in a Class C amplifier in accordance with the present invention is illustrated in FIG. 2, in which the components in this Figure corresponding to those of FIG. 1 have been designated with like reference numerals.

In order to inhibit oscillations of the Class C amplifier, a relatively large value resistor 30 is connected across the base-emitter junction of the transistor 10. With a sufficiently large value resistor, the resistance between the base and the emitter of the transistor 10 reduces the sensitivity of the transistor and inhibits spurious oscillations in the output signal of the amplifier.

However, the large value resistor 30 will allow a high forward bias to be applied to the base of the transistor 10 in the event that a collector-base breakdown of the transistor 10 occurs. For unanticipated load conditions it is possible that the forward bias voltage at the base of the transistor 10 will reach a level sufficient to cause heavy conduction of the transistor 10 which in turn will result in failure of the transistor 10.

A compromise between a high value resistor for inhibiting oscillations and a low value resistor for preventing transistor failure must therefore be utilized. The compromise resistance value is normally found to be so low that it is no longer effective to inhibit spurious oscillations of the amplifier.

In order to overcome this constraint in the design of Class C amplifiers a diode 32 is placed in series with the inductor 28 and in parallel with the resistor 30. The diode 32 has a forward conduction voltage which is less than the voltage required to bias the transistor 10 to the destructive point. For example, an IN4004 diode has been found to be suitable for this purpose in a practical implementation of the stabilizing circuit. If the base voltage of the transistor 10 increases and the attendant collector-base breakdown occurs due to load variations, the diode 32 will become forward biased and prevent the base voltage of transistor 10 from reaching the destructive point. With this arrangement the resistor 30 can have a resistance value sufficiently high enough to inhibit spurious oscillations of the amplifier while the possibility of transistor failure due to load variations is eliminated.

A capacitor 34 can be connected in parallel with the diode 32. The capacitor 34 provides a signal at an output terminal 36 which can be used to test for the presence of an incoming signal to the base of the transistor 10.

With the diode 32 in place, the resistor 30 may in theory be eliminated, thus achieving the highest degree of stabilization against spurious oscillations. However, in practice it is preferable to utilize a resistor in parallel with the inductor or the diode-inductor circuit in order to damp any oscillations resulting from resonance of the inductor with other circuit elements.

Figure 3:
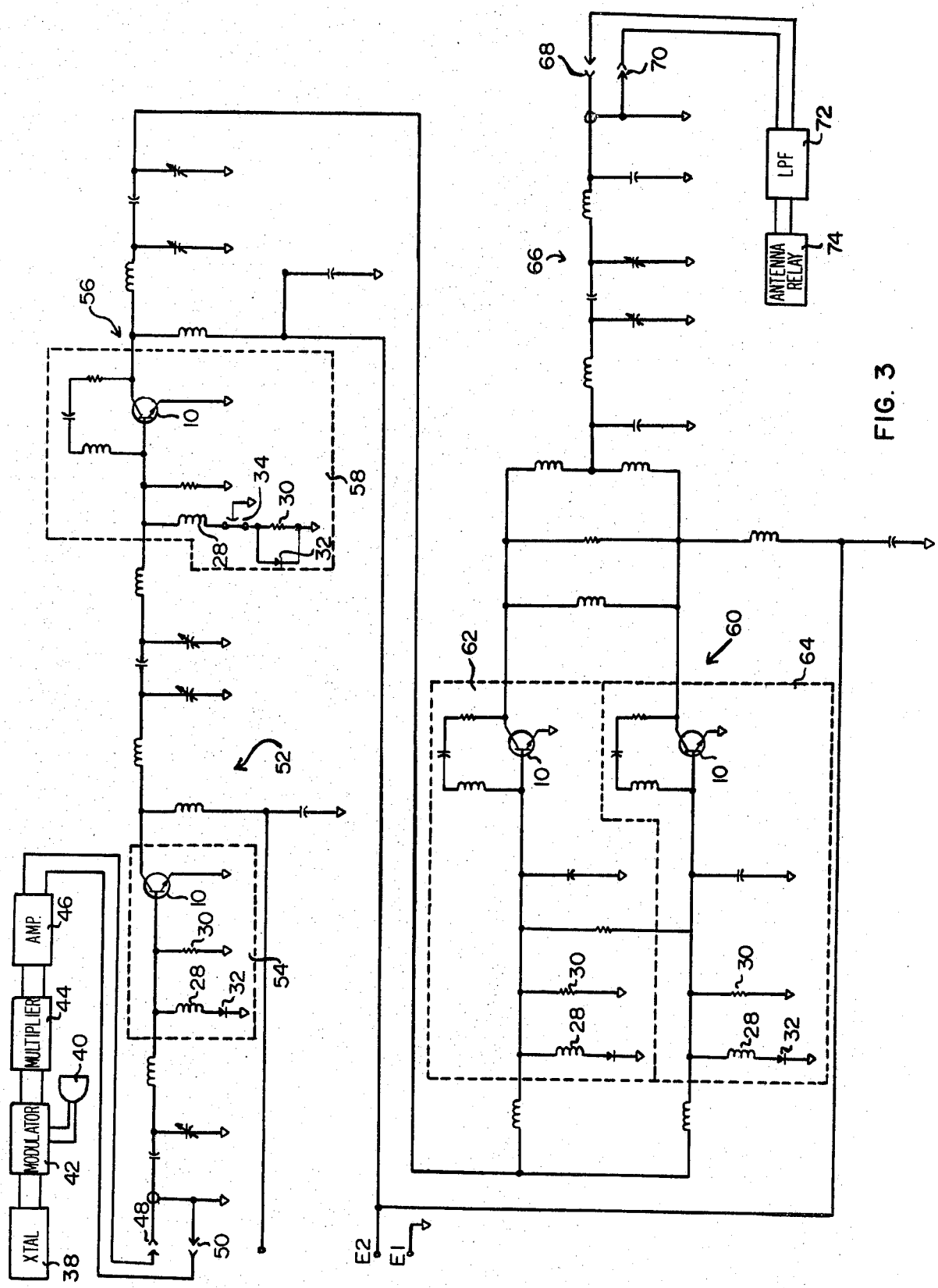
FIG. 3 is a partial block and partial schematic circuit diagram of a power amplifier incorporating four stabilized Class C amplifiers.

A power amplifier for a transceiver which includes four stabilized Class C amplifiers is illustrated in FIG. 3. The transceiver includes a crystal 38 which generates a carrier wave signal having a predetermined frequency. This carrier wave signal can be phase or frequency modulated in a modulator 42 with an information signal from a microphone 40. The modulated signal is suitably processed by a frequency multiplier 44 and an amplifier 46. The output signal from the amplifier 46 is presented to the input terminals 48, 50 of the power amplifier.

The modulated signals at the input terminals of the power amplifier pass through filtering circuitry and are presented to a predriver circuit 52. The predriver circuit 52 includes a stabilized Class C amplifier 54. The Class C amplifier 54 comprises a transistor 10, filtering inductor 28, bias resistor 30 and diode 32. The Class C amplifier 54 operates in the manner described previously to inhibit spurious oscillations in the output signal of the amplifier and prevent failure of the transistor 10 due to changes in the load of the amplifier.

The output signal from the predriver circuit 52 is passed through additional filtering circuitry and presented to a driver circuit 56. The driver circuit 56 includes a second stabilized Class C amplifier 58. The stabilized Class C amplifier 58 includes the transistor 10, filtering inductor 28, bias resistor 30 and diode 32, as well as a test capacitor 34.

The output signal from the driver circuit 56 passes through additional filtering circuitry and is presented to a final power amplifier 60. The final power amplifier 60 includes a pair of stabilized Class C amplifiers 62, 64 connected in parallel with one another. The output signal from the driver circuit 56 is presented to both of these Class C amplifiers.

The output signals from the Class C amplifiers 62, 64 are combined and presented to a matching and low-pass filter circuit 66. This matching and filter circuit 66 forms the final stage of the power amplifier. The output signals from the power amplifier at the output terminals 68, 70 are presented to an additional low-pass filter 72. The output signals from the low-pass filter 72 is then presented to an antenna relay 74 for transmission of the modulated signal.

Each of the stabilized Class C amplifiers 54, 58, 62 and 64 and the power amplifier operates in the manner described previously to inhibit spurious oscillations in the output signal of the amplifier and to prevent failure of the transistor in each amplifier due to unanticipated changes in the load of the amplifier. These advantages are obtained in a relatively simple manner and with a minimum number of components, and therefore can be achieved in an economical manner.

The present invention may be embodied in other specific forms without departing from the spirit or essential characteristics thereof. The presently disclosed embodiment is therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. A Class C amplifier of the type used in radio communications having a stabilization circuit for preventing spurious oscillations in the output signal of the amplifier and for reducing the chances of transistor failure due to changing load conditions, comprising:
   an amplifying transistor biased to operate in the Class C mode of operation;
   a circuit element connected between the base and emitter junctions of said amplifying transistor for inhibiting spurious oscillations in the transistor; and
   means responsive to the voltage across said circuit element for limiting the base voltage of said amplifying transistor to prevent transistor failure.

2. The stabilized Class C power amplifier of claim 1 wherein said circuit element comprises a resistor connected between the base and emitter junctions of said transistor.

3. The stabilized Class C amplifier of claim 2 wherein said voltage limiting means is a diode connected in parallel with said resistor.

4. The stabilized Class C amplifier of claim 1 wherein said voltage limiting means is a diode connected between the base and emitter junctions of said transistor.

5. The stabilized Class C power amplifier of claim 4 wherein said diode has a forward conduction voltage which is less than the voltage required to bias said amplifying transistor to a destructive point.

6. A method for stabilizing the operation of a Class C power amplifier by substantially inhibiting the spurious oscillations inherent to such an amplifier and by reducing the chances of failure due to changing load conditions, comprising the steps of:
   providing an element of resistance between the base and emitter junctions of a transistor biased to operate in a Class C mode of operation, to inhibit spurious oscillations in the output signal of said amplifier; and
   limiting the voltage which can be developed across said resistance element to a predetermined value to prevent said transistor from failing.

7. The method of claim 6 wherein said predetermined value is less than the maximum recommended base voltage for said transistor.

8. A stabilized Class C power transistor amplifier comprising:
   an amplifying transistor biased to operate in the Class C mode of operation;
   an impedance element having one terminal thereof connected to the base of said transistor;
   a resistor connected between the other terminal of said impedance element and the emitter of said transistor for inhibiting the inherent tendency of the transistor to oscillate; and
   a diode connected in parallel with said resistor such that said diode will become forward biased when the voltage across said resistor reaches a predetermined value less than the voltage required to bias said transistor to a point of failure.

9. A Class C amplifier of the type used in radio communications having a stabilization circuit for preventing spurious oscillations in the output signal of the amplifier and for reducing the chances of transistor failure due to changing load conditions, comprising:
   an amplifying transistor biased to operate in the Class C mode of operation;
   means for applying a base bias voltage to said amplifying transitor sufficient to inhibit spurious oscillations in the transistor; and
   means responsive to said base voltage for limiting the base voltage of said amplifying transistor to prevent transistor failure.

10. The stabilized Class C amplifier of claim 9 wherein said bias voltage applying means is a resistor connected between the base and emitter of said transistor.

11. The stabilized Class C amplifier of claim 10 wherein said limiting means is a diode responsive to the voltage across said resistor.

* * * * *